(12) United States Patent
Perez-Bravo

(10) Patent No.: US 11,908,842 B2
(45) Date of Patent: Feb. 20, 2024

(54) LIGHT EMITTING DISPLAY WITH IMPROVED WIDE ANGLE COLOR VIEWING

(71) Applicant: Nanolumens Acquisition, Inc., Peachtree Corners, GA (US)

(72) Inventor: Jorge Perez-Bravo, Alpharetta, GA (US)

(73) Assignee: Nanolumens Acquisition, Inc., Peachtree Corners, GA (US)

( * ) Notice: Subject to any disclaimer, the term of this patent is extended or adjusted under 35 U.S.C. 154(b) by 111 days.

(21) Appl. No.: 17/555,333

(22) Filed: Dec. 17, 2021

(65) Prior Publication Data

US 2022/0189932 A1 Jun. 16, 2022

Related U.S. Application Data

(63) Continuation of application No. 16/703,060, filed on Dec. 4, 2019, now Pat. No. 11,217,566.

(60) Provisional application No. 62/781,884, filed on Dec. 19, 2018.

(51) Int. Cl.
*H01L 33/52* (2010.01)
*H01L 25/075* (2006.01)

(52) U.S. Cl.
CPC .......... *H01L 25/0753* (2013.01); *H01L 33/52* (2013.01)

(58) Field of Classification Search
CPC ..... H01L 25/167; H01L 27/153; H01L 27/32; H01L 27/3202; H01L 27/3204; H01L 27/3209; H01L 27/3225; H01L 27/3251; H01L 27/3258; H01L 51/50; H01L 51/525; H01L 51/5287; H01L 2227/32; H01L 2227/326; H01L 2251/5323; H01L 2251/5338; H01L 2251/5353; H01L 2251/56; H01L 2251/566; H01L 29/12041; H01L 29/12044
See application file for complete search history.

(56) References Cited

U.S. PATENT DOCUMENTS

| | | |
|---|---|---|
| 5,747,928 A | 5/1998 | Shanks et al. |
| 6,332,690 B1 | 12/2001 | Murofishi |
| 6,819,045 B2 | 11/2004 | Okita et al. |
| 6,974,971 B2 | 12/2005 | Young |
| 7,242,398 B2 | 7/2007 | Nathan et al. |

(Continued)

*Primary Examiner* — Moin M Rahman
(74) *Attorney, Agent, or Firm* — Troutman Pepper Hamilton Sanders LLP; James E. Schutz; Jacob M. Burr

(57) ABSTRACT

Disclosed are embodiments of apparatus and methods that provide light emitting displays with improved wide angle color viewing. A plurality of light emitting elements is arranged in a predetermined pattern and collectively creates a viewing plane. A portion of the light emitting elements are disposed in a primary orientation while the remainder of the light emitting element are disposed in a complementary orientation. Each light emitting element in a primary orientation is adjacent to a light emitting element in the complementary orientation. The spatial light emission pattern of the primary orientation is complementary to the spatial light emission pattern of the complementary orientation. Adjacent pairs of primary-complementary oriented light emitting elements cancel a substantial amount of color variation that would otherwise be seen when one varies the gaze angle upon the viewing plane.

17 Claims, 13 Drawing Sheets

(56) References Cited

U.S. PATENT DOCUMENTS

| | | |
|---|---|---|
| 7,636,085 B2 | 12/2009 | Yang |
| 7,710,370 B2 | 5/2010 | Slikkerveer et al. |
| 7,714,801 B2 | 5/2010 | Kimmel |
| 7,825,582 B2 | 11/2010 | Furukawa et al. |
| 7,834,537 B2 | 11/2010 | Kee et al. |
| 7,834,962 B2 | 11/2010 | Satake et al. |
| 7,868,545 B2 | 1/2011 | Hioki et al. |
| 7,977,170 B2 | 7/2011 | Tredwell et al. |
| 8,023,060 B2 | 9/2011 | Lin et al. |
| 8,096,068 B2 | 1/2012 | Van Rens |
| 8,097,812 B2 | 1/2012 | Wang et al. |
| 8,098,486 B2 | 1/2012 | Hsiao et al. |
| 8,228,667 B2 | 7/2012 | Ma |
| 8,284,369 B2 | 10/2012 | Chida et al. |
| 8,319,725 B2 | 11/2012 | Okamoto et al. |
| 8,456,078 B2 | 6/2013 | Hashimoto |
| 8,471,995 B2 | 6/2013 | Tseng et al. |
| 8,477,464 B2 | 7/2013 | Visser et al. |
| 8,493,520 B2 | 7/2013 | Gay et al. |
| 8,493,726 B2 | 7/2013 | Visser et al. |
| 8,654,519 B2 | 2/2014 | Visser et al. |
| 8,780,039 B2 | 7/2014 | Gay et al. |
| 8,816,977 B2 | 8/2014 | Rothkopf et al. |
| 8,873,225 B2 | 10/2014 | Huitema et al. |
| 8,982,545 B2 | 3/2015 | Kim et al. |
| 9,117,384 B2 | 8/2015 | Phillips et al. |
| 9,176,535 B2 | 11/2015 | Bohn et al. |
| 9,286,812 B2 | 3/2016 | Bohn et al. |
| 9,335,793 B2 | 5/2016 | Rothkopf |
| 9,372,508 B2 | 6/2016 | Wang |
| 9,459,656 B2 | 10/2016 | Shai |
| 2006/0098153 A1 | 5/2006 | Slikkerveer et al. |
| 2006/0204675 A1 | 9/2006 | Gao et al. |
| 2007/0241002 A1 | 10/2007 | Wu et al. |
| 2008/0042940 A1 | 2/2008 | Hasegawa |
| 2008/0165551 A1* | 7/2008 | Okada ............... G02F 1/133615 362/613 |
| 2008/0218369 A1* | 9/2008 | Krans ................. A47G 11/003 313/511 |
| 2009/0189917 A1 | 7/2009 | Benko et al. |
| 2011/0134144 A1 | 6/2011 | Moriwaki |
| 2012/0002360 A1 | 1/2012 | Seo et al. |
| 2012/0092363 A1 | 4/2012 | Kim et al. |
| 2012/0313862 A1 | 12/2012 | Ko et al. |
| 2013/0100392 A1 | 4/2013 | Fukushima |
| 2015/0349034 A1* | 12/2015 | Hack .................... H10K 59/351 257/40 |
| 2016/0013249 A1* | 1/2016 | Wang .................. H10K 50/852 257/40 |
| 2017/0127539 A1 | 5/2017 | Drabant et al. |
| 2018/0374412 A1* | 12/2018 | Kaneko .................... G09F 9/30 |

* cited by examiner

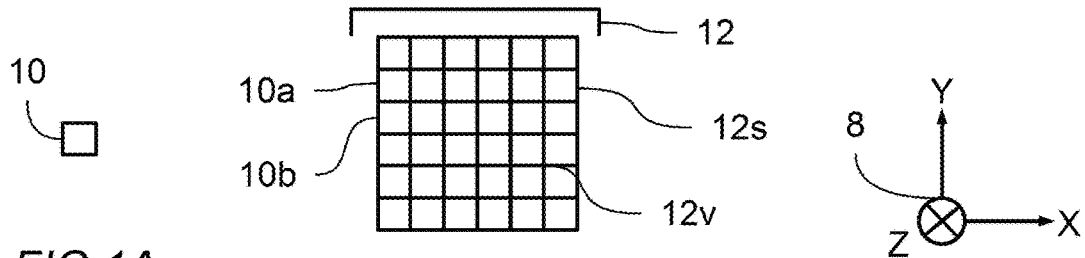
FIG 1A  FIG 1B
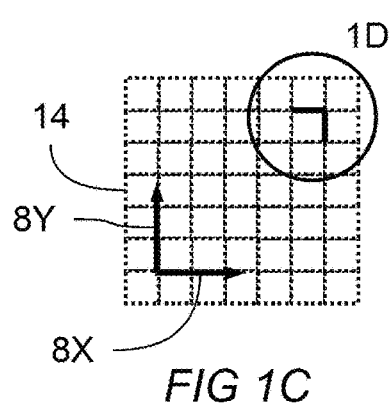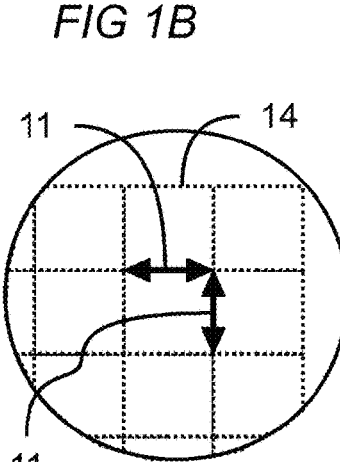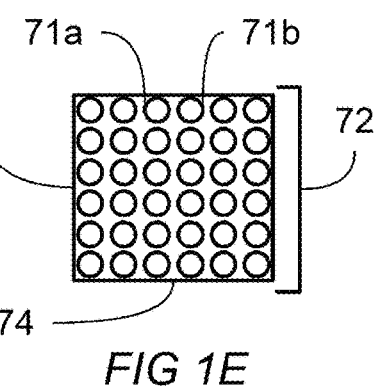
FIG 1C  FIG 1D  FIG 1E
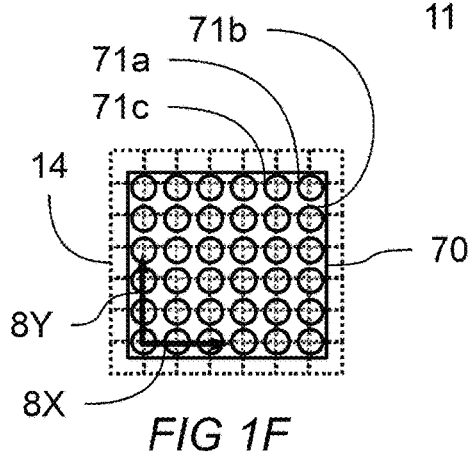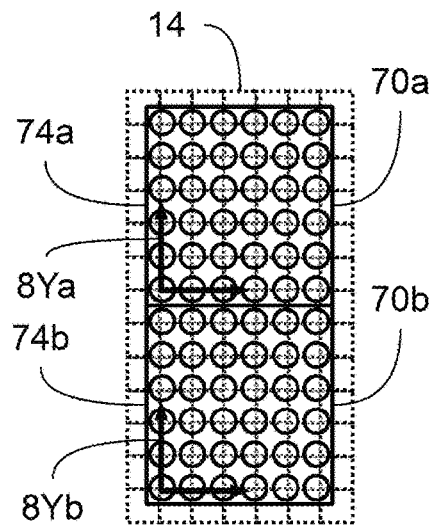
FIG 1F  FIG 1G
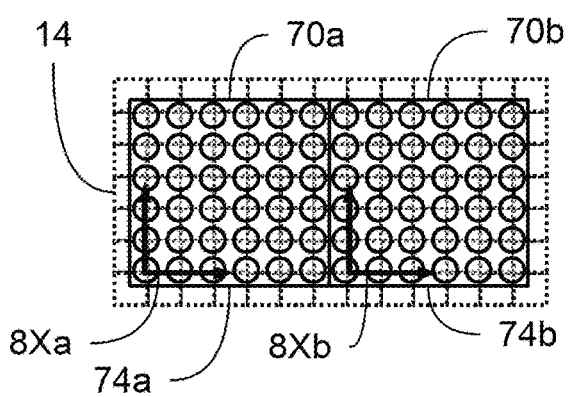
FIG 1H

LIGHT EMITTING DISPLAY WITH IMPROVED WIDE ANGLE COLOR VIEWING

CROSS REFERENCE TO RELATED APPLICATIONS

This non-provisional utility application claims the benefit of and is a continuation of application Ser. No. 16/703,060, filed Dec. 4, 2019 and entitled "Light Emitting Display with Improved Wide Angle Color Viewing". Application Ser. No. 16/703,060 claims the benefit of U.S. Provisional Application No. 62/781,884, filed Dec. 18, 2018, entitled "Light Emitting Display with Improved Wide Angle Color Viewing". Application Ser. Nos. 16/703,060 and 62/781,884 are herein incorporated by reference.

BACKGROUND

Large, light-emitting displays find many uses in both public and private spaces owing to their large size, high resolution, and vivid colors. One can already find large information displays taking on important roles in providing airport, train station and bus station travelers with information relevant to their travels. In addition, other high visual impact applications of large light emitting displays include advertising and entertainment. Such displays deliver a compelling experience to the viewer. Such experiences cannot be duplicated on small display screens.

A light emitting display produces a viewable image on the viewing plane of the display. Large light emitting displays possess different viewing characteristics as compared to small light emitting displays. If a light emitting display is small, or the viewer is far away relative to the absolute size of the viewing plane, then the viewer may be expected to see the entire viewing plane in a single glance that doesn't require the viewer to shift their gaze angle. A large light emitting display may be of a physical size comparable to and, oftentimes, much larger than the person seeing the viewing plane. Consequently, a person viewing the large screen may need to shift their gaze angle to take in the entirety of the viewing plane.

A current state-of-the-art, large, light emitting display, when viewed with a shifting view angle, will show inconsistency in the colors produced. In particular a viewer, upon shifting their gaze angle, will see shifting color and intensity as their gaze angle changes with respect to the viewing plane. Wider changes in gaze angle typically produce greater shifts in color and intensity. In consideration of the foregoing problems with large light emitting displays, solutions to the problems of shifting color and intensity with gaze angle, it is clear that embodiments of the present disclosure confer numerous advantages and are therefore highly desirable.

SUMMARY

The present disclosure is directed to systems and methods for improving the consistency of both color and intensity of large light emitting displays with respect to changes in the gaze angle of the viewer.

Light emitting displays of the present disclosure comprise a plurality of light emitting elements fixed on a substrate in a predetermined pattern, the plurality of light emitting elements collectively creating a viewing plane suitable for the viewing of visual media. In some embodiments the viewing plane may be defined by a viewer, with respect to the viewer's central position in front of the viewing plane, as extending up, down, left, and right. The light emission from each light emitting element may then be characterized in its color and intensity with respect to gaze angle of the viewer, as the viewer's gaze angle tilts to take in views of up, down, left, and right portions of the viewing plane. An optical measurement system operating with a view onto the viewing plane may be used to quantify the color and brightness received by the optical measurement system at any gaze angle that looks upon any portion of the viewing plane.

Each light emitting element comprises at least one light emitting device. In some embodiments light emitting elements comprise at least one each of red (R), green (G), and blue (B), in which the R, G, and B light emitting devices are all disposed at predetermined positions within an outer housing in a known orientation. In some embodiments half of the plurality of light emitting elements is disposed on the substrate in a primary orientation, while the other half of the plurality of light emitting devices is disposed on the substrate in a complementary orientation that is defined as a 180-degree rotation of the primary orientation. Each light emitting element of the plurality of light emitting elements that is fixed on the substrate in the primary orientation is adjacent to at least one light emitting element that is fixed on the substrate in the complementary orientation. At the same time, each light emitting element of the plurality of light emitting elements that is fixed on the substrate in the complementary orientation is adjacent to at least one light emitting element that is fixed on the substrate in the primary orientation.

In some embodiments the predetermined pattern of light emitting elements is configured into rows of light emitting elements. Along each row the orientation of light emitting elements alternates between primary and complementary orientations, the orientation changing between each adjacent pair of light emitting elements.

In some embodiments the predetermined pattern is configured into columns of light emitting elements. Along each column the orientation of light emitting elements alternates between primary and complementary orientations, the orientation changing between each adjacent pair of light emitting elements.

In some embodiments the predetermined pattern is configured into a pattern of rows and columns of light emitting elements. Within each row and within each column the orientation of light emitting elements alternates between primary and complementary orientations, the orientation changing between each adjacent pair of light emitting elements.

In some embodiments, the light emitting devices within each light emitting element are disposed in about a linear pattern, the pattern having a top-most device and also a bottom-most device. A primary orientation may be defined so that the linear pattern of light emitting devices is aligned in a known orientation with respect to the viewing plane. A complementary orientation may then be defined as about a 180-degree rotation of the primary orientation.

A grouping of light emitting elements may be defined in which one light emitting element in a primary orientation is disposed adjacent to a light emitting element in a complementary orientation. The display plane may then be tiled by a plurality of such groupings.

In an exemplary embodiment, a light emitting display system with improved wide angle color viewing comprises:
  a) a plurality of light emitting elements disposed on a substrate in a predetermined pattern, said plurality of light emitting elements collectively creating a viewing plane, said predetermined pattern further characterized in that each light emitting element is located a pitch distance away from two adjacent light emitting elements, said pitch distance being uniform across said viewing plane;

b) each light emitting element comprising a plurality of light emitting devices, said light emitting devices disposed within each light emitting element in a predetermined pattern, each of said light emitting devices operative to produce a color, the combination of colors produced by said plurality of light emitting devices effective for producing a color spectrum;

c) the plurality of light emitting elements further characterized in that it comprises a first portion of light emitting elements disposed in a primary orientation and a second portion of light emitting elements disposed in a complementary orientation, said first and second portions containing about the same number of light emitting elements, the complementary orientation being defined as about a 180-degree rotation of said primary orientation;

d) the plurality of light emitting elements further characterized in that each light emitting element in the primary orientation is disposed adjacent to one or more light emitting elements in the complementary orientation; and, e) the plurality of light emitting elements further characterized in that each light emitting element in the complementary orientation is disposed adjacent to one or more light emitting elements in the primary orientation.

BRIEF DESCRIPTION OF THE DRAWINGS

These and other features, aspects, and advantages of the present invention will become better understood with regard to the following description, appended claims, and accompanying drawings where:

FIG. 1A shows a square consistent with a regular four-sided polygon.

FIG. 1B shows a square tiling of a two-dimensional plane.

FIG. 1C shows coordinate axis defined on square tiling. Enlarged view 1D is indicated.

FIG. 1D shows an enlarged view of the indicated region of FIG. 1C showing uniform row and column pitch distance.

FIG. 1E shows a plan view of a display module having a plurality of light emitting elements coordinate axis defined on square tiling.

FIG. 1F shows the display module of FIG. 1E overlaid with the predetermined pattern of square tiling and coordinate axes.

FIG. 1G shows a plan view of two display modules aligned along their y-axis.

FIG. 1H shows a plan view of two display modules aligned along their x-axis.

LIST OF REFERENCE NUMBERS APPEARING IN THE FIGURES

Figure 2A:
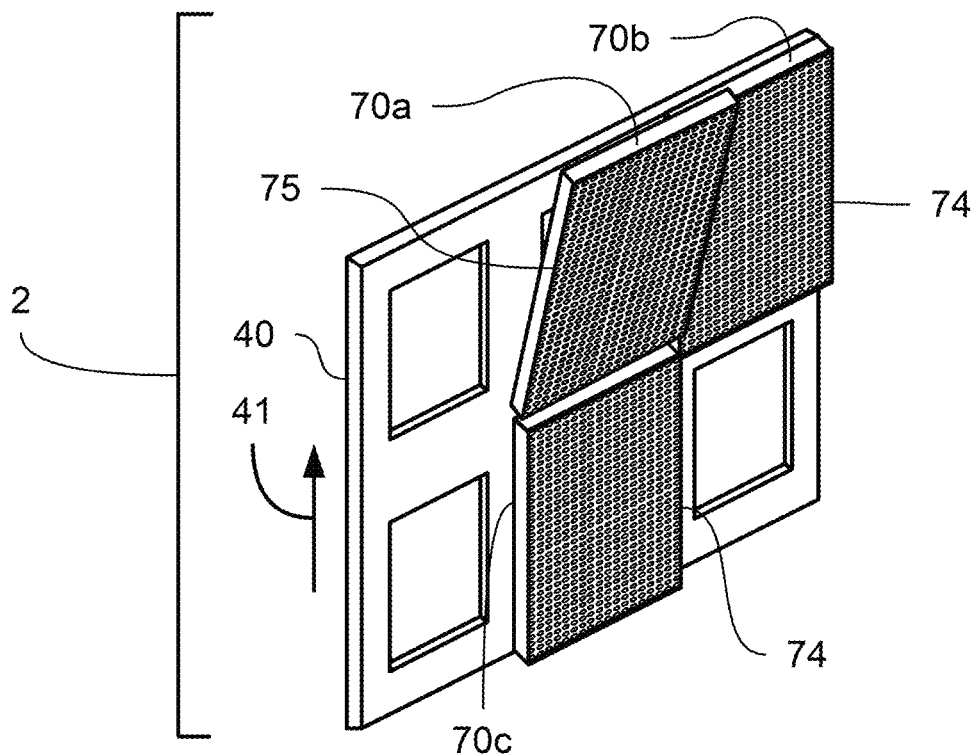
FIG. 2A shows a perspective view of a system of display modules installed on a support frame. One display module is shown in the midst of being either installed or removed.

2—light emitting display system
8—coordinate system showing x-axis, y-axis, and z-axis
8X—x-axis
8Xa, 8Xb—first x-axis, second x-axis
8Y—y-axis
8Ya, 8Yb—first y-axis, second y-axis
8Z—z-axis
10—square tile, which is a regular 4-sided polygon
10a, 10b, etc.—first square, second square, etc.
11—pitch distance
12—square tiling of the plane
12v—representative vertex of the square tiling
12s—representative side of the square tiling
14—predetermined pattern corresponding to a tiling of the plane
16—1931 CIE color space chromaticity diagram
18—Rec709 color space
D65—CIE standard daylight illuminant at a simulated 6500 degrees kelvin
20—substrate
28N—observer at a gaze angle that is normal (perpendicular) to the viewing plane
28R—observer at a gaze angle that is angled to the right with respect to the viewing plane
28L—observer at a gaze angle that is angled to the left with respect to the viewing plane
28U—observer at a gaze angle that is angled upward with respect to the viewing plane
28D—observer at a gaze angle that is angled downward with respect to the viewing plane
30—outer housing
32—optical encapsulant
34a, 34b, etc.—first light emitting device, second light emitting device, etc.
40—support frame
41—support direction
70—display module
70a, 70b, 70c, . . . —first, second, third, etc. display module
71—light emitting element
71a, 71b, etc.—first, second, etc. light emitting element
72—plurality of light emitting elements
73a—primary orientation
73b—complementary orientation
74—display plane
74a, 74b—first display plane, second display plane
75—display plane disposed at a first angle with respect to the viewing plane
76—grouping of light emitting elements
76a, 76b, 76c—first, second, third grouping of light emitting elements
77—first group spacing
78—second group spacing
80—viewing plane
80R—rightmost edge of the viewing plane
80L—leftmost edge of the viewing plane
80U—uppermost edge of the viewing plane
80D—downmost edge of the viewing plane

DETAILED DESCRIPTION

Embodiments of the present disclosure provide apparatus and methods capable of providing large light emitting displays with improved wide angle color viewing. In particular, the present disclosure describes solutions to the problems of shifting color and intensity with gaze angle in large light emitting displays.

To facilitate the present description, and with reference to FIG. 1A-1H, it will be useful now to turn to the construction of a display according to various embodiments of the present disclosure. Tessellation of a planar surface is the tiling of the plane using one or more geometric shapes, called tiles, creating no gaps and no overlaps. A periodic tiling has a repeated geometric pattern. A regular tiling is a tiling in which all tiles are regular polygons having the same size and shape. Square, triangular, and hexagonal tilings are each an example of a regular, periodic tiling that can achieve a tessellation of a planar surface without gaps or overlaps. Tilings are of special interest in the construction of modular displays because their properties enable the construction of large displays with desirable properties. Assembling a plurality of smaller display modules in which each display module is configured to have a size, shape, and orientation corresponding to a predetermined tiling may produce a large display having no gaps and no overlaps between adjacent display modules.

Within a single display module, a plurality of light emitting elements may be arranged in a predetermined pattern derived from an appropriately configured tiling. A planar tiling of regular polygons consists of edges and vertexes. The set of vertexes of a regular polygon tiling can be seen to create a pattern with a high degree of regularity. A highly uniform visual effect may be produced by placing a light emitting element at or about each of the vertexes of a regular polygon tiling.

Light emitting elements of the present disclosure may each comprise a single light emitting device or multiple light emitting devices. A preferred light emitting element combines red, blue, and green light emitting devices within one light emitting element so as to provide full color spectrum display. Monochrome and other combinations of light emitting devices may be used still within the spirit and scope of this disclosure. In other embodiments a light emitting element may comprise white, red, blue, and green devices within a single light emitting element. In other embodiments a light emitting element may comprise red, green, blue, and cyan devices. In other embodiments a light emitting element may comprise red, green, blue, yellow, and cyan devices, or any combination of devices emitting at different colors within a single light emitting element. In other embodiments multiple devices emitting at substantially the same color may be used.

In creating a uniform visual effect, it is useful to consider a property called pitch distance, which is the distance between any light emitting element and its closest adjacent light emitting elements. It can be seen that a highly uniform visual effect is produced by maintaining a highly uniform pitch throughout a single display module and across a plurality of adjacent display modules. Preferred embodiments of the present disclosure use light emitting elements located at or about the vertexes of a regular polygon tiling. A regular square tiling is one such preferred tiling, producing a uniform visual effect by providing uniform spacing between both rows and columns of light emitting elements. The spacing between adjacent rows and between adjacent columns of a regular square tiling may be referred to as the pitch of that pattern. In such a square tiling, it can be seen that any light emitting element will have at least two closest adjacent neighboring elements that are spaced apart from each other by a distance close to or substantially equal to the pitch distance.

In addition to uniform pitch within a single display module, the spacing between display modules can be controlled so that uniform pitch of light emitting elements is maintained across a plurality of assembled display modules. A preferred embodiment is to provide a display module with a perimeter region of a predetermined width containing no light emitting elements. The preferred width of the perimeter region is less than or about equal to one half of the pitch distance, when measured inward and along the edges of the regular polygon tiling defining the location of the plurality of the light emitting elements. When two display modules are assembled adjacent to one another, each module may provide a perimeter region width of about one half of the pitch, which cumulatively creates a pattern of uniform pitch spanning both modules. A plurality of display modules may thereby be assembled to create uniform pitch spanning the plurality of display modules.

A single display module may comprise a plurality of light emitting elements coupled to a substrate and arranged in a predetermined pattern corresponding to the vertexes of a regular polygon tiling. The display module has a perimeter. A plurality of display modules may be assembled such that a portion of the perimeter of each display module abuts a portion of the perimeter of at least one other display module, each module positioned to maintain uniform pitch spacing across the plurality of display modules.

Turning now to FIG. 1A, shown is a regular four-sided polygon, also called a square 10, consistent with the square tiling 12 of the two-dimensional plane shown in FIG. 1B. A coordinate system 8 is indicated so as to make discussion of geometry features of the present disclosure clearer. Square tiling 12 is comprised of a plurality of square tiles, of which first square 10a and second square 10b are typical, arranged so that no gaps and no overlaps are produced. When arranged into the predetermined pattern shown in FIG. 1B, the square tiling 12 can be seen to create a plurality of vertex 12v and a plurality of side 12s, in which every vertex 12v is separated a distance of about 12s from each of its closest neighboring vertexes.

FIG. 1C shows predetermined pattern corresponding to a tiling of the plane 14 according to a square tiling. Overlaid onto the predetermined pattern corresponding to a tiling of the plane 14 are x-axis 8X and y-axis 8Y, showing that a coordinate system can be overlaid onto the predetermined pattern to facilitate clear disclosure of the location and alignment of other features to be described. The enlarged section, denoted FIG. 1D, shows that the square tiling of the plane gives rise to a highly uniform spacing of vertexes, which can be characterized as pitch distance 11. Pitch distance 11 corresponding to the predetermined pattern 14 gives rise to uniform spacing between rows and columns when that predetermined pattern is based upon a square tiling. It can be seen that row spacing and column spacing are both about equal to the pitch distance 11.

Turning now to FIG. 1E, shown is a display module 70 having a plurality of light emitting elements 72, of which first light emitting element 71a and second light emitting element 71b are individual members of the plurality. Plurality of light emitting elements 72 is shown arranged according to a predetermined pattern so as to create a highly uniform visual effect upon display plane 74. FIG. 1F shows how predetermined pattern 14 according to a square tiling of the plane may be used to position individual light emitting elements 71a, 71b, and 71c according to the location of the vertexes of said predetermined pattern 14. Superimposed upon the plurality of light emitting elements are x-axis 8X and y-axis 8Y. The display module 70 of FIG. 1F comprises a plurality of light emitting elements, each of which may be a single light emitting device or multiple light emitting devices. A preferred light emitting element combines red, blue, and green light emitting devices within one light emitting element so as to provide full color spectrum display. Monochrome and other combinations of devices may be used still within the spirit and scope of this disclosure. The display modules of FIG. 1E and FIG. 1F each have a region adjacent to their perimeter that is free from light emitting elements. This enables close spacing of adjacent modules as will now be seen.

FIG. 1G shows a first display module 70a adjacent to a second display module 70b and disposed so that their display planes 74a and 74b abut and their respective y-axes 8Ya and 8Yb are substantially aligned, thereby creating a highly uniform visual effect that spans the combined display modules. A pitch distance can be defined between adjacent light emitting elements between adjacent display modules that is substantially equal to the pitch distance between adjacent light emitting elements within a single display module.

FIG. 1H shows a first display module 70a adjacent to a second display module 70b and disposed so that their respective display planes 74a and 74b abut and their respective x-axes 8Xa and 8Xb are substantially aligned, thereby creating a highly uniform visual effect that spans the combined display modules. A pitch distance can be defined between adjacent light emitting elements between adjacent display modules that is substantially equal to the pitch distance between adjacent light emitting elements within a single display module. When abutted and aligned in the foregoing manner, two adjacent modules may be combined such that their combined plurality of light emitting elements are disposed upon a single predetermined pattern 14 defining a regular tiling of the plane.

FIG. 1G and FIG. 1H make it clear that a large display may be constructed from display modules designed according to the teaching of FIG. 1A-FIG. 1H. Such a large display will tile the two-dimensional plane without gaps and without overlaps and produce a highly uniform visual effect. Any number of display modules may be combined in both x and y directions to make a large display that is substantially free from visual aberrations.

Figure 2B:
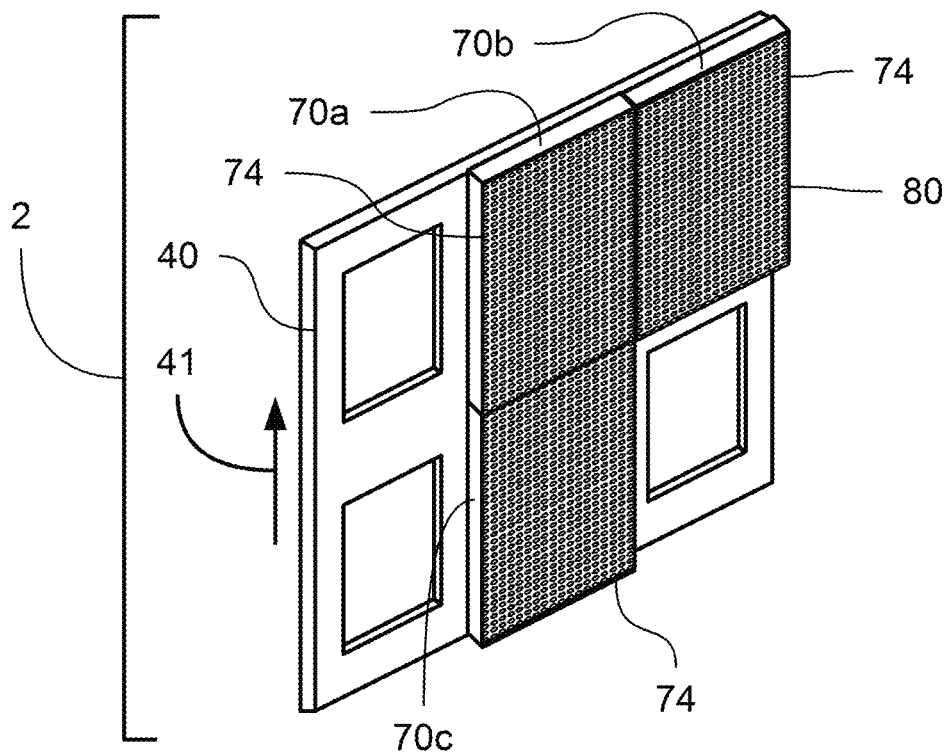
FIG. 2B shows a perspective view of a system of display modules installed on a support frame. Three installed modules are shown collectively creating a viewing plane.

FIG. 2A and FIG. 2B show perspective views of a light emitting display system 2 comprising a plurality of display modules 70a, 70b, 70c installed on a support frame 40, consistent with the display modules described previously, however, the drawing is simplified for clarity. First display module 70a of FIG. 2A is shown with display plane 75 tilted at angle with respect to the collectively established viewing plane of the previously installed display modules, second display module 70b and third display module 70c. When first display module 70a is moved to an installed position, alignment and complementary alignment features are moved to become operatively engaged for establishing and maintaining alignment between the display planes of adjacent display modules. The display planes of first, second, and third display modules, 70a, 70b, and 70c, respectively, are urged to remain aligned and substantially co-planar by means of the action of multiple alignment features. Viewing plane 80 is thereby created without visible gaps between display modules or other visual aberrations.

According to the embodiment of FIGS. 2A and 2B it can be understood that it is advantageous to build a large light emitting display from a plurality of similar or substantially identical display modules. It can also be understood that the teachings of the present disclosure are equally valid when building a large light emitting display as a single unified unit, or when building a large light emitting display from a plurality of display modules of different shapes.

Figure 3:
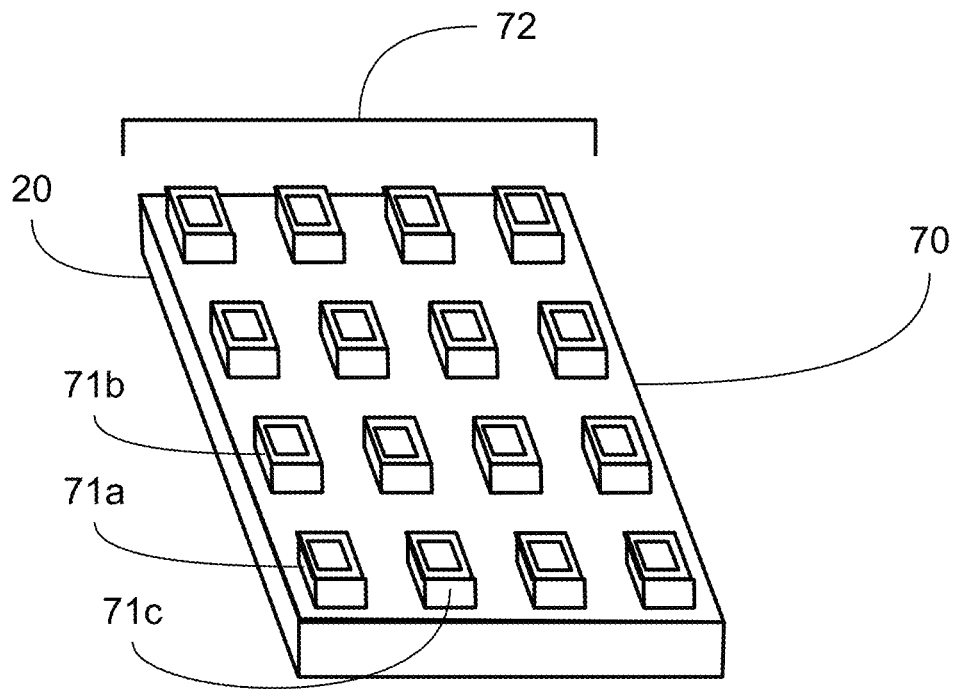
FIG. 3 shows a perspective view of a plurality of light emitting elements disposed on a substrate.

Turning now to FIG. 3, shown is a close-up perspective view of a portion of a light emitting display module 70. A plurality of light emitting elements 72 is shown disposed in a predetermined pattern on substrate 20. Substrate 20 may provide both electrical and mechanical functionality. At least a portion of substrate 20 may provide for the attachment of said plurality of light emitting elements 72 on a display side and may provide for the attachment of driving circuitry on a back side or the front side and may provide electrical interconnection between display side and back side.

Figures 4A, 4B:
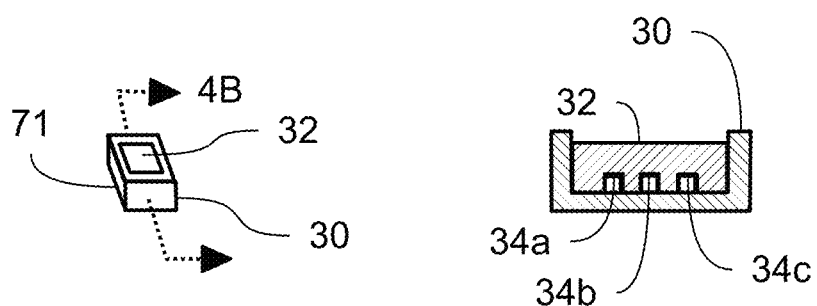
FIG. 4A shows a perspective view of a light emitting element. Cross section view 4B is indicated.
FIG. 4B shows a cross section view a light emitting element.

The light emitting elements of the present disclosure may be better understood now with reference to FIG. 4A and FIG. 4B. Shown in FIG. 4A and FIG. 4B is light emitting element 71, comprising a plurality of light emitting devices 34a, 34b, and 34c disposed within outer housing 30. A substantially transparent optical encapsulant 32 is shown overlaying the plurality of light emitting devices, protecting the devices from assault from environmental factors. The first, second, and third light emitting devices, 34a, 34b, and 34c, respectively, are disposed within the recess of outer housing 30 so that each device may transmit emitted light through optical encapsulant 32 and outward from light emitting element 71. In a typical embodiment, the plurality of light emitting devices disposed within each light emitting element will comprise at least one device emitting a red color, at least one device emitting a green color, and at least one device emitting a blue color. It can be seen that the plurality of light emitting devices enables the light emitting element to produce a spectrum of colors based upon the primary colors provided by the light emitting devices. The full spectrum of colors produced collectively by a grouping of light emitting devices may be referred to as a color space or a color gamut.

While embodiments of light emitting elements of the present disclosure may be described herein in terms of a set of primaries consisting of {Red, Green, Blue}, other combinations of primaries are possible and may be desirable in other contexts. Light emissive systems work according to additive color perception of colors. The full gamut of color available in any additive color system is defined by all the possible combinations of all the possible luminosities of each primary color in that system. In chromaticity space, the color gamut is a plane convex polygon with corners at the primaries. For three primaries the corresponding convex polygon is a triangle.

Figure 5:
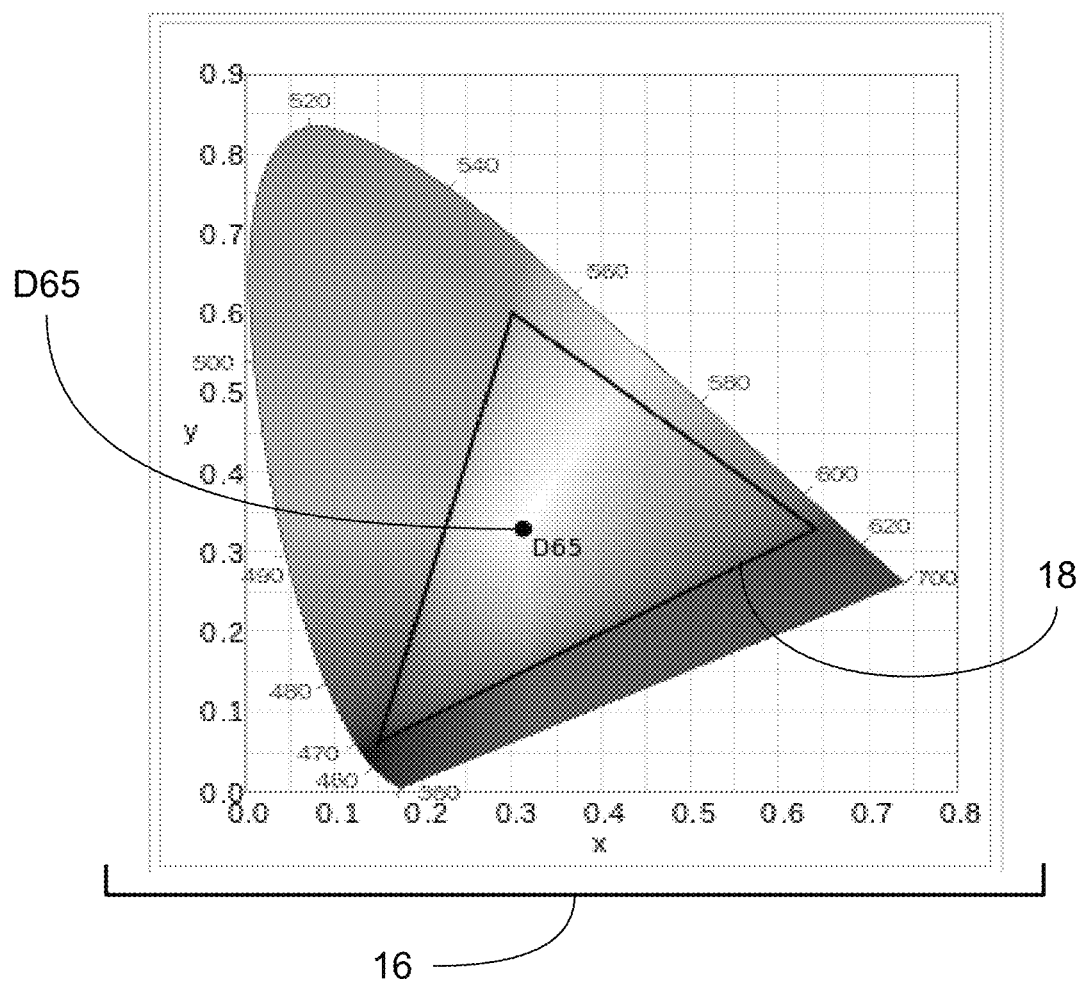
FIG. 5 shows an X-Y chromaticity chart, daylight white at color temperature 6500° K being indicated, rec709 color space being indicated.

FIG. 5 shows an X-Y chromaticity diagram 16 corresponding to the 1931 CIE standard. The X-Y coordinates are a way to specify the location of a color within the color gamut represented by the full color spectrum of the 1931 CIE standard. A commonly used color space for emissive systems called Rec709 is shown in FIG. 5 as a triangle with reference number 18. The Rec709 color space 18 can be seen as a triangle in FIG. 5, the corners being the colors of the primaries used to produce the full gamut of colors contained within the triangular color space 18. Denoted on FIG. 5 is the location of the D65 CIE defined standard daylight illuminant, which corresponds to white light produced with a correlated color temperature of approximately 6500 degrees kelvin. The accepted location of D65 in X-Y chromaticity coordinates is x=0.31271, y=0.32902. Any color within the X-Y color gamut of FIG. 5 may be characterized in its pythagorean distance from the D65 point. For a sample color located at X-Y coordinates of {Xc, Yc}, its pythagorean distance from D65 may be computed according to the formula:

$$\text{DistanceFrom}D65 = \sqrt{(Xc - 0.31271)^2 + (Yc - 0.32902)^2}.$$

When a light emitting element comprising a plurality of light emitting devices is mounted to a substrate, the illuminations that it produces shine outward from the light emitting element into space. The color perceived by a viewer of that light emitting element is sensitive to the angle from which the viewer is looking. Color shift with respect to changing view angle is caused by a number of factors: location of each light emitting device within the light emitting element; shape and depth of the outer housing; differing degrees to which the outer housing occludes the light emission from each light emitting device; and emissions properties of each light emitting device. Color shift with changing view angle is undesirable in large high resolution displays.

Figure 6A:
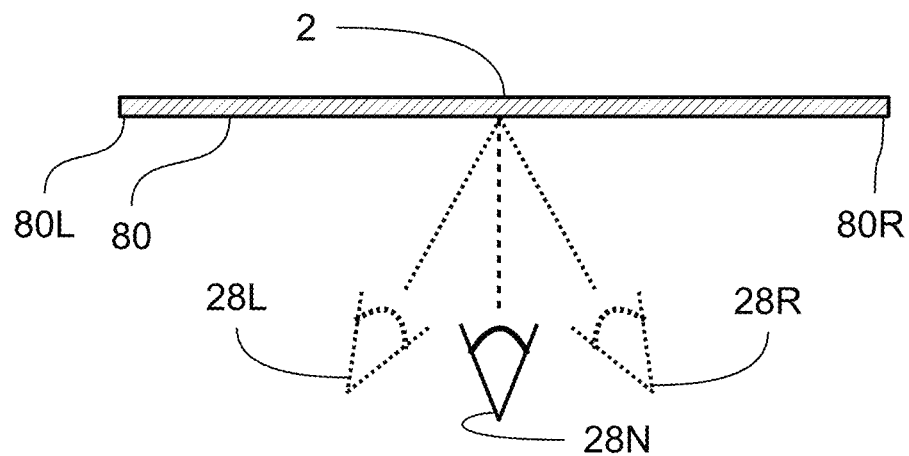
FIG. 6A shows an overhead plan view of a viewing plane on which left, center and right viewing angles are defined.
Figure 6B:
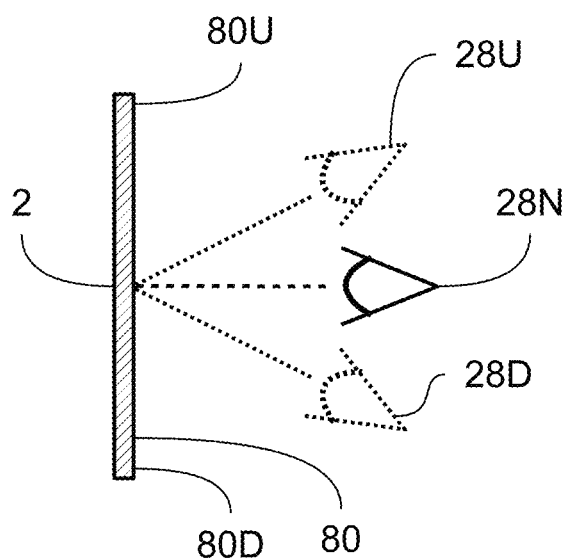
FIG. 6B shows a left side plan view of a viewing plane on which up, center and down viewing angles are defined.

With reference now to FIG. 6A and FIG. 6B, color shift with changing viewing angle is given further exposition. FIG. 6A shows an overhead plan view of a light emitting display system 2 having a viewing plane 80 that has both a rightmost extent 80R and a leftmost extent 80L, and an observer positioned to view a particular spot on said viewing plane from three different gaze angles: a normal gaze angle 28N; a rightward gaze angle 28R; and a leftward gaze angle 28L. Similarly, FIG. 6B shows a left side plan view of a light emitting display system 2 having a viewing plane 80 that has both an uppermost extent 80U and a downmost extent 80D, and an observer positioned to view a particular spot on said viewing plane from three different gaze angles: a normal gaze angle 28N; an upward gaze angle 28U; and a downward gaze angle 28D.

The previously described D65 white point may be used to characterize the color shift seen at various gaze angles. Color shift as a function of gaze angle can be demonstrated by adjusting the displayed image to produce the D65 color at a normal gaze angle, then measuring the perceived color of the same displayed image at a variety of non-normal gaze angles. The impact of gaze angle on color perception can be characterized as a color shift some distance away from the D65 point. The observed color shift may be characterized in terms of measured X-Y chromaticity coordinates and the distance away from D65, as computed from the prior formula, for non-normal gaze angles corresponding to those measured X-Y chromaticity coordinates. The following three-column table shows experimentally derived distances from D65 as a function of gaze angle. The column titled "Prior" are measurements of a display screen prior to applying the teachings of the present disclosure, whereas the column titled "New" are measurements of a display screen in which the current teachings are operative to improve the display.

| Gaze Angle | Prior-Distance from D65 | New-Distance from D65 |
| --- | --- | --- |
| 0° | 0.0000 | 0.0000 |
| 20° Right | 0.0060 | 0.0062 |
| 40° Right | 0.0195 | 0.0090 |
| 60° Right | 0.0014 | 0.0061 |
| 80° Right | 0.0253 | 0.0072 |
| 20° Left | 0.0075 | 0.0061 |
| 40° Left | 0.0244 | 0.0091 |
| 60° Left | 0.0138 | 0.0054 |
| 80° Left | 0.0050 | 0.0054 |
| 20° Up | 0.0178 | 0.0071 |
| 40° Up | 0.0514 | 0.0049 |
| 60° Up | 0.1012 | 0.0034 |
| 80° Up | 0.1281 | 0.0026 |
| 20° Down | 0.0098 | 0.0055 |
| 40° Down | 0.0150 | 0.0034 |

| Gaze Angle | Prior-Distance from D65 | New-Distance from D65 |
|---|---|---|
| 60° Down | 0.0391 | 0.0056 |
| 80° Down | 0.1105 | 0.0034 |

Figure 7:
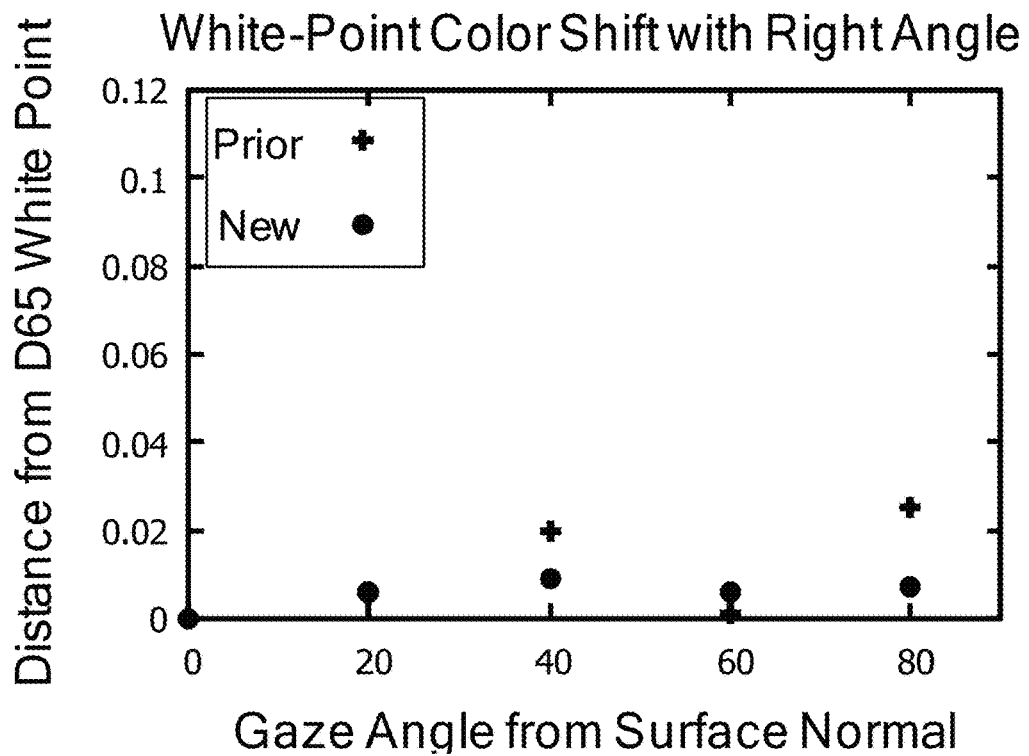
FIG. 7 is a chart that shows the measured distance from true 6500° K white point with respect to rightward gaze angles of 0, 20, 40, 60, and 80 degrees. The chart shows the reduced color shift with respect to changing view angle provided by the teachings of the present disclosure.
Figure 8:
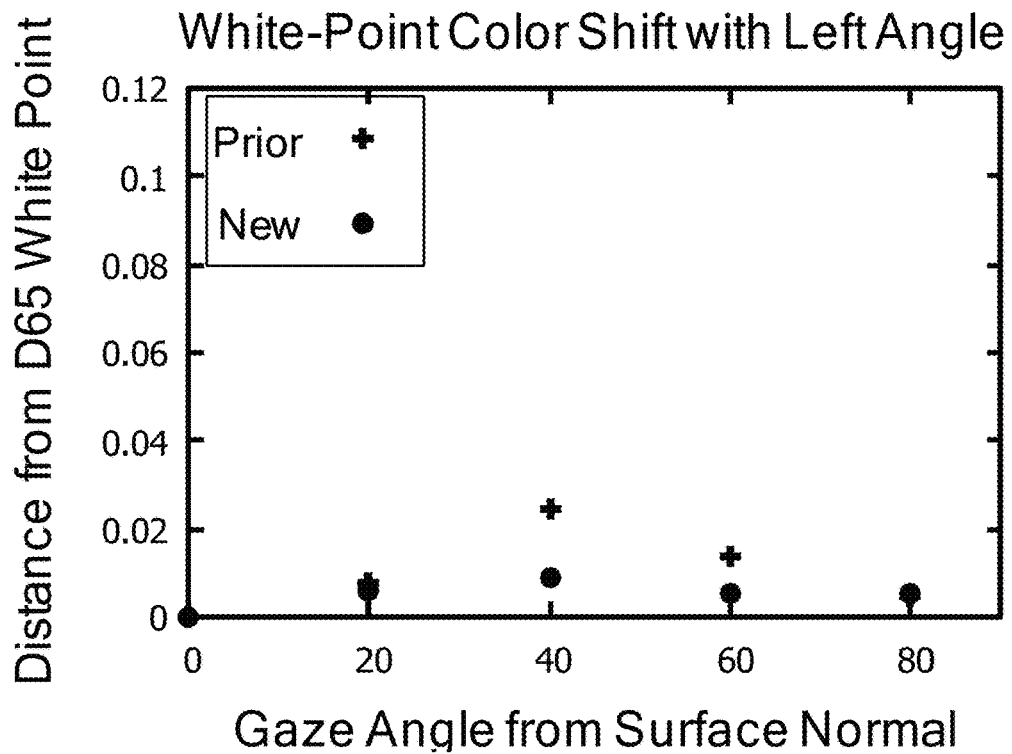
FIG. 8 is a chart that shows the measured distance from true 6500° K white point with respect to leftward gaze angles of 0, 20, 40, 60, and 80 degrees. The chart shows the reduced color shift with respect to changing view angle provided by the teachings of the present disclosure.
Figure 9:
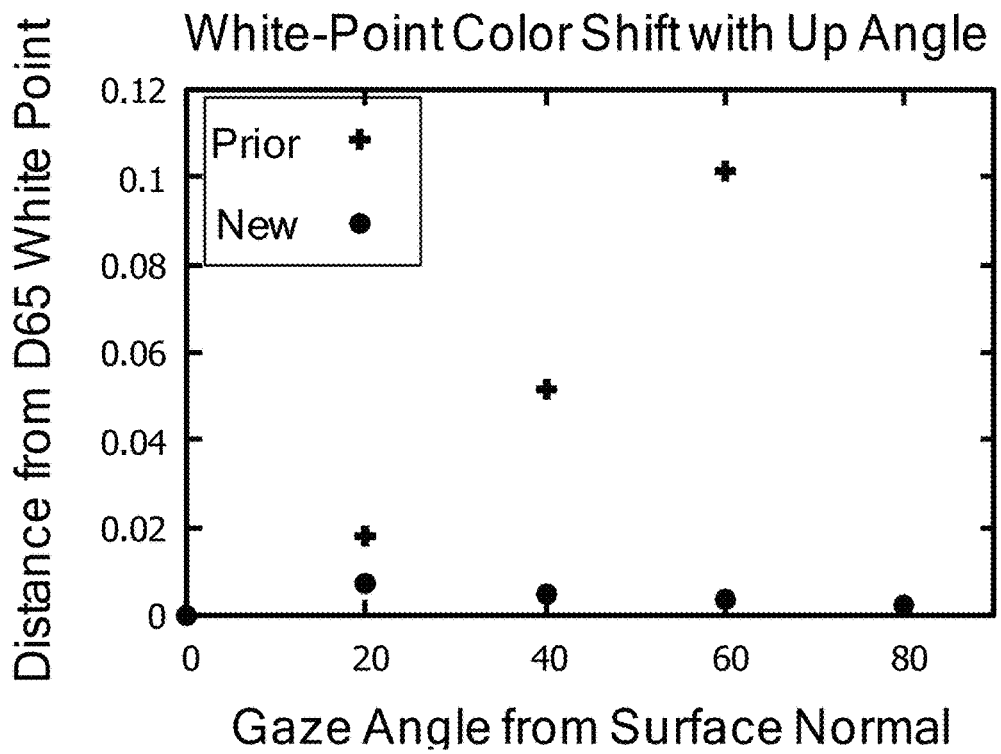
FIG. 9 is a chart that shows the measured distance from true 6500° K white point with respect to upward gaze angles of 0, 20, 40, 60, and 80 degrees. The chart shows the reduced color shift with respect to changing view angle provided by the teachings of the present disclosure.
Figure 10:
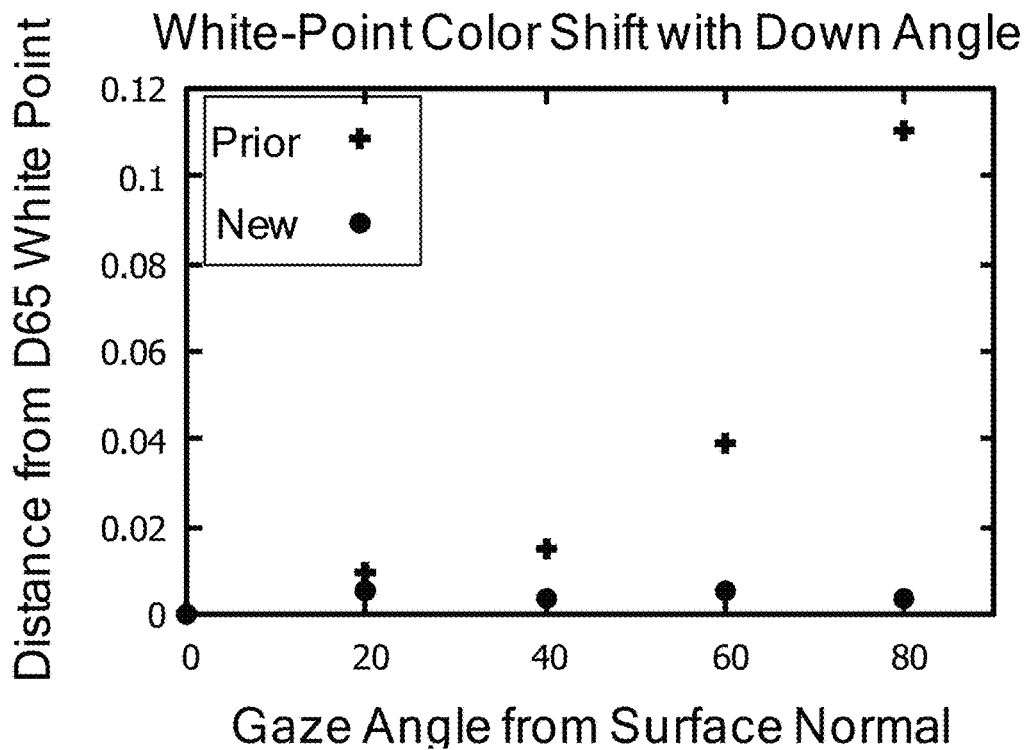
FIG. 10 is a chart that shows the measured distance from true 6500° K white point with respect to downward gaze angles of 0, 20, 40, 60, and 80 degrees. The chart shows the reduced color shift with respect to changing view angle provided by the teachings of the present disclosure.

FIGS. 7-10 graphically summarize the performance with respect to gaze angle of a light emitting display prior to the teachings of the present disclosure as compared to the performance of a light emitting display when using the new teachings. In the figures, the bold cross symbol denotes data points pertaining to prior art systems, whereas the bold dot symbol denotes data points pertaining to the new improved systems and methods of the present disclosure. It can be seen that: FIG. 7 is a chart that shows the measured distance from true D65 white point with respect to rightward gaze angles of 0, 20, 40, 60, and 80 degrees; FIG. 8 is a chart that shows the measured distance from true D65 white point with respect to leftward gaze angles of 0, 20, 40, 60, and 80 degrees; FIG. 9 is a chart that shows the measured distance from true D65 white point with respect to upward gaze angles of 0, 20, 40, 60, and 80 degrees; and, FIG. 10 is a chart that shows the measured distance from true D65 white point with respect to downward gaze angles of 0, 20, 40, 60, and 80 degrees.

Figure 11A:
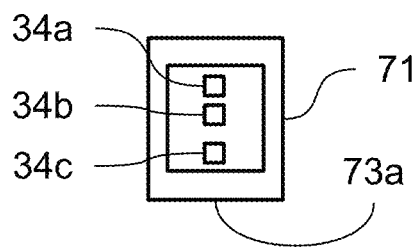
FIG. 11A shows an overhead plan view of a light emitting element disposed in a primary orientation.

Turning now to FIG. 11A, shown is an overhead plan view of an embodiment of a light emitting element 71, having disposed in a predetermined pattern within an outer perimeter that defines the device, three light emitting devices: a first light emitting device 34a; a second light emitting device 34b; and a third light emitting device 34c. The light emitting element of FIG. 11A is shown in a primary orientation 73a. Primary orientation 73a can be understood now with reference to FIG. 11B, which shows the same light emitting element 71 as shown in FIG. 11A, but in a different orientation, namely complementary orientation 73b. The primary orientation of FIG. 11A may be rotated by about 180 degrees to form the complementary orientation of FIG. 11B. When a light emitting element in a primary orientation is placed adjacent to a light emitting element in a complementary orientation a synergy in light emissions is produced by the additive combination of the light produced by the pair of light emitting elements. The improvement made thereby decreases the amount of color shifting that may be perceived when shifting gaze angle from normal to other non-normal gaze angles.

According to the present disclosure, a light emitting display may be constructed with improved color shifting properties by placing a plurality of light emitting elements on a substrate in a primary orientation and then placing adjacent to each of these a light emitting element in a complementary orientation. It can be understood that there are a number of ways in which a plurality of light emitting elements in a primary orientation may be located with respect to a plurality of light emitting elements in a complementary orientation so that each light emitting element is disposed adjacent to a light emitting element of the opposite orientation. A large viewing plane may be constructed by repeating the primary orientation-complementary orientation grouping across the viewing plane. Visual media may then be displayed on such a display system and it will show reduced color shift with gaze angle.

Figure 11B:
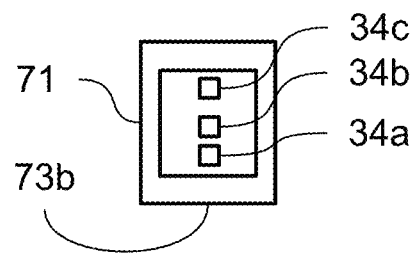
FIG. 11B shows an overhead plan view of the light emitting element of FIG. 11A disposed in a complementary orientation.

FIG. 11A and FIG. 11B show an embodiment of a light emitting element having a generally linear arrangement of three light emitting devices. Different numbers of light emitting devices and different placements are contemplated and are considered within the scope of other embodiments of this disclosure. A primary orientation and a secondary orientation for each arrangement and number of light emitting devices may still be defined by taking a primary orientation and rotating it about 180 degrees into a complementary orientation.

Figure 12A:
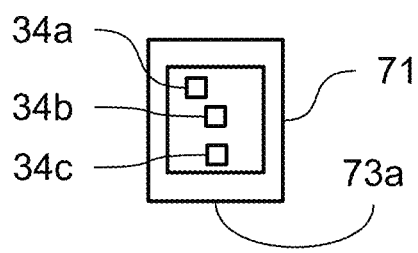
FIG. 12A shows an overhead plan view of another light emitting element disposed in a primary orientation.
Figure 12B:
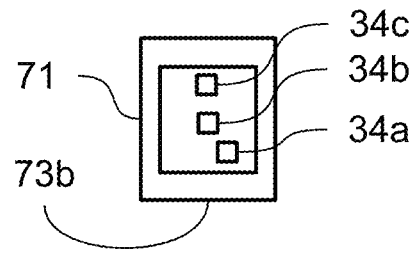
FIG. 12B shows an overhead plan view of the light emitting element of FIG. 12A disposed in a complementary orientation.

The previously described systems and methods to achieve improved color shifting with gaze angle are also effective in other embodiments of light emitting elements. FIG. 12A and FIG. 12B show another embodiment of light emitting element 71 in which a plurality of light emitting devices is disposed within an outer housing, the placement of said plurality of devices being predetermined, but said placement having no particular symmetry with respect to the overall shape of the light emitting element. FIG. 12A shows light emitting element 71 in a primary orientation 73a, while FIG. 12B shows the same light emitting element 71 in a complementary orientation 73b. It can be seen that primary orientation and secondary orientation disclosed in FIGS. 12A and 12B differ by a rotation of about 180 degrees from each other.

Disposing a light emitting element in a primary orientation adjacent to a light emitting element in a secondary orientation and repeating that fundamental grouping across the substrate and across the viewing plane is highly effective for reducing color shifting. It is noted that each light emitting element comprising the viewing plane may be considered a pixel, or picture element, of the display system. In a preferred embodiment of a display system, millions of pixels are provided. The so-called HD format specifies a viewing plane of 1920 pixels by 1080 pixels (2,073,600 pixels in total), whereas the so-called 4K format specifies a viewing plane of 3840 pixels by 2160 pixels (8,294,400 pixels in total). As a consequence of the large number of pixels used to convey images in high pixel-count formats such as HD and 4K, it is the case that, within any given image, the vast majority of adjacent pixels are called upon to display nearly the same color and intensity as the pixels immediately adjacent. Expressing the same relationship in another way, there is a high correlation between the brightness and color displayed by any two pixels that are immediately adjacent to one another. Some embodiments of the present disclosure, when applied to HD, 4K, or viewing planes configured to other resolutions, will effectuate a viewing plane on which one half of the pixels are provided by light emitting elements in the primary orientation and one half of the pixels are provided by light emitting elements in the complementary orientation.

Figure 13:
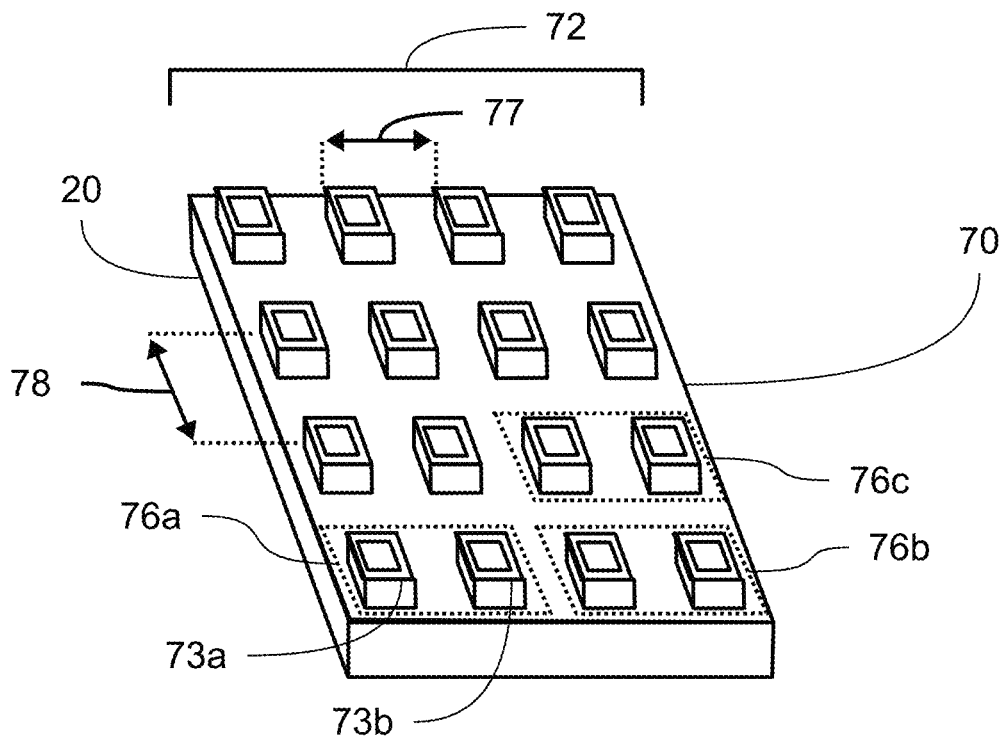
FIG. 13 shows a perspective view of a portion of a viewing plane comprising a plurality of light emitting elements in a primary orientation and another plurality of light emitting elements in a complementary orientation.

FIG. 13 shows a portion of display module 70 having a plurality of light emitting elements 72, said plurality of light emitting elements defined by a plurality of grouped light emitting elements 76a, 76b, 76c, etc. Each group of light emitting elements is shown comprising a light emitting element in a primary orientation 73a adjacent to a light emitting element in a complementary orientation 73b. The display plane of the display module may be comprised of a suitable tiling of said grouped light emitting elements. Each group of grouped light emitting elements may be spaced apart from adjacent groups by a first group spacing 77 in a horizontal direction, and a second group spacing 78 in a vertical direction. A viewing plane may then be constructed of one or more display modules, the entire viewing plane comprising a plurality of grouped light emitting elements, each group having a light emitting element in a primary orientation and a light emitting element in a complementary orientation.

The embodiment of FIG. 13 shows a preferred embodiment in which both first group spacing 77 and second group spacing 78 are about equal. In some preferred embodiments both first and second group spacings are about equal to the pitch distance between light emitting elements. When the embodiment according to FIG. 13 is used to display an image, the image having a resolution defined by a predetermined pattern of pixels, each light emitting element comprising the embodiment of FIG. 13 may display one pixel of said image.

Figure 14:
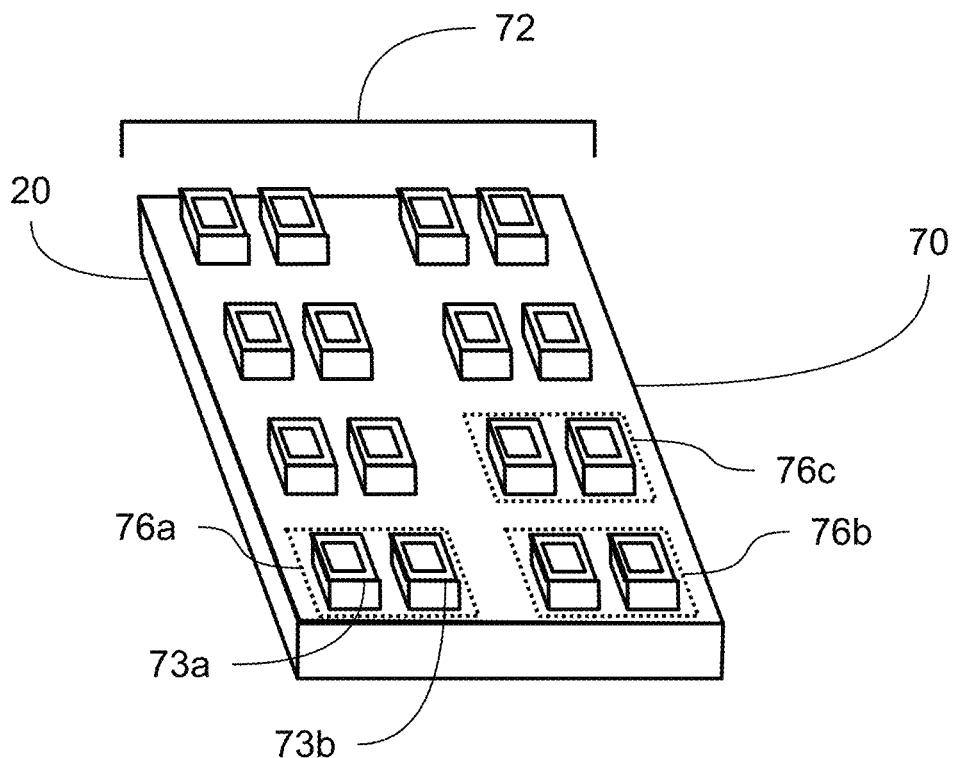
FIG. 14 shows a perspective view of a portion of another viewing plane comprising a plurality of light emitting elements in a primary orientation and another plurality of light emitting elements in a complementary orientation.

Turning now to FIG. 14, shown is another embodiment of a portion of a display module 70 having a plurality of light emitting elements 72, the plurality of light emitting being arranged as a plurality of groupings 76a, 76b, 76c, etc. Each group of light emitting elements is shown comprising a light emitting element in a primary orientation 73a adjacent to a light emitting element in a complementary orientation 73b. The display plane of the display module may be comprised of a suitable tiling of said grouped light emitting elements. A viewing plane may then be constructed of one or more display modules, the entire viewing plane comprising a plurality of grouped light emitting elements, each group having a light emitting element in a primary orientation and a light emitting element in a complementary orientation. The embodiment of FIG. 14 shows an equal spacing, or gap, between adjacent groups of light emitting elements, in both horizontal and vertical directions.

Figure 15:
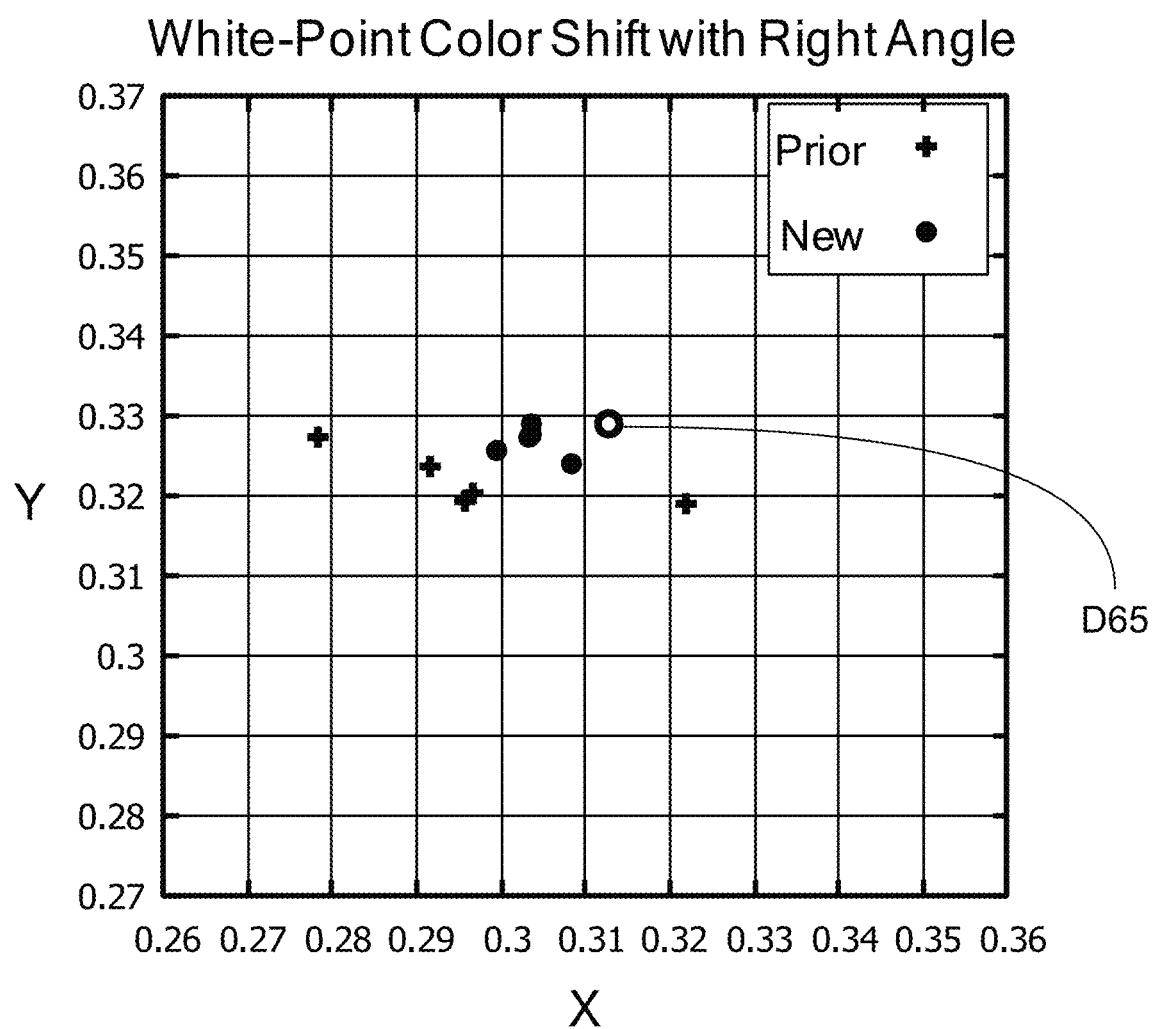
FIG. 15 is an X-Y chromaticity chart showing the location in X-Y coordinates for the measured 6500° K white point with respect to changing Right viewing angle. The chart shows the reduced color shift with respect to changing view angle provided by the teachings of the present disclosure.
Figure 16:
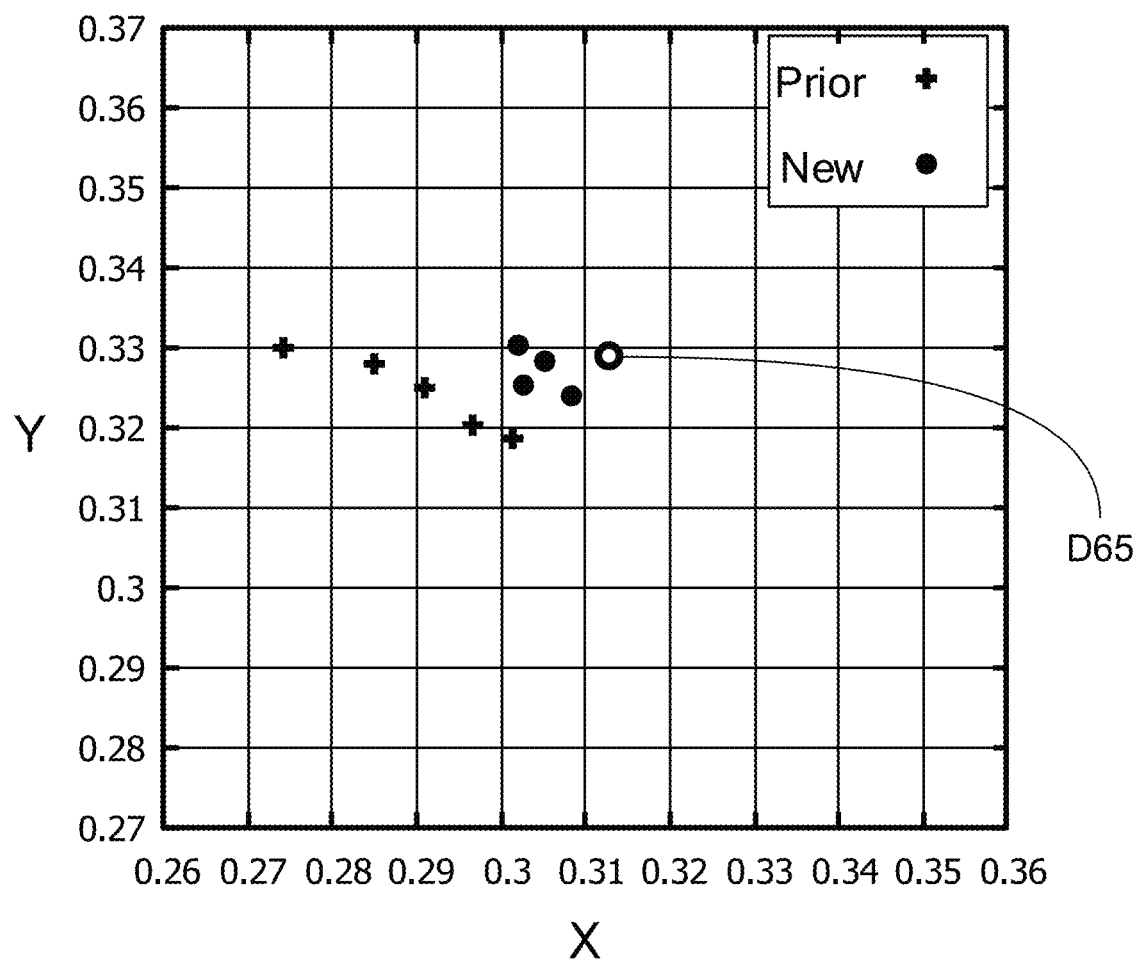
FIG. 16 is an X-Y chromaticity chart showing the location in X-Y coordinates for the measured 6500° K white point with respect to changing Left viewing angle. The chart shows the reduced color shift with respect to changing view angle provided by the teachings of the present disclosure.
Figure 17:
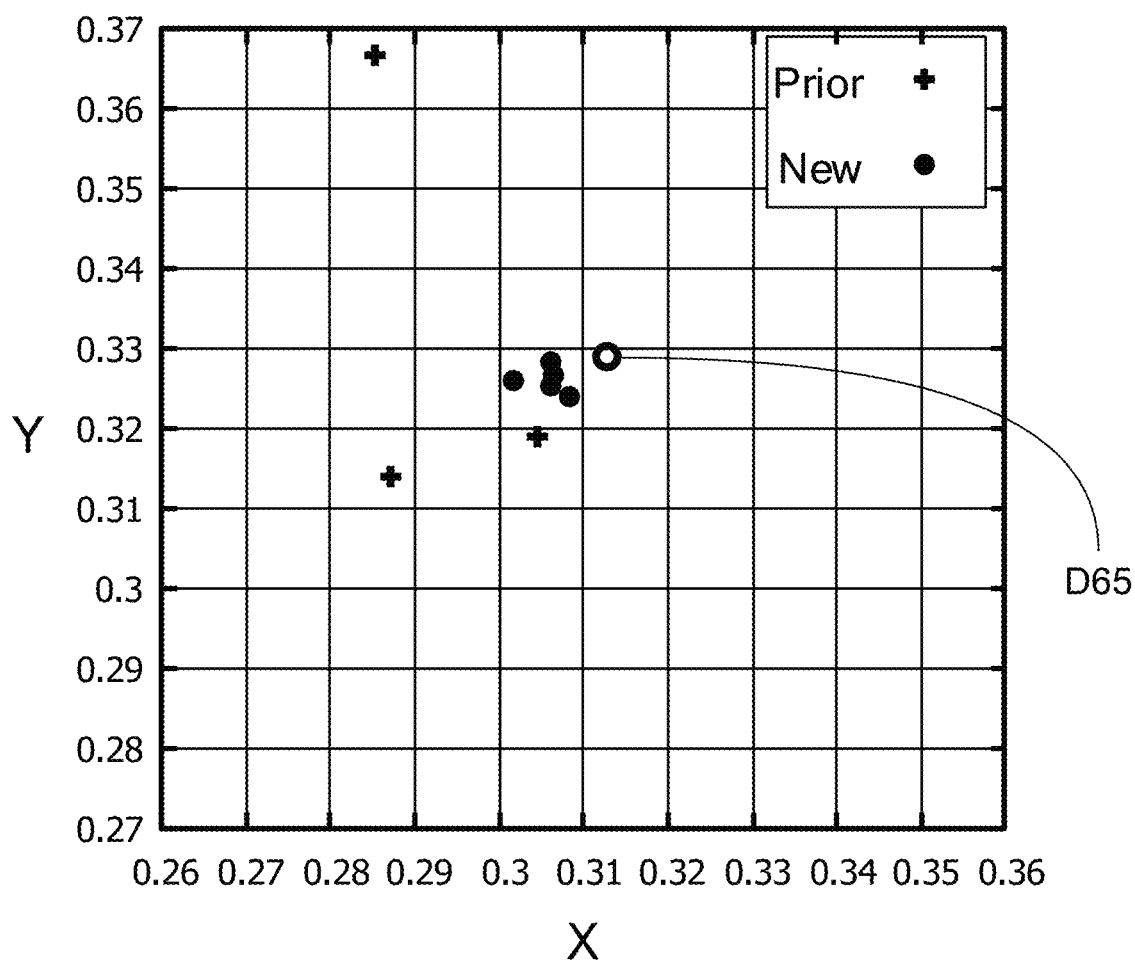
FIG. 17 is an X-Y chromaticity chart showing the location in X-Y coordinates for the measured 6500° K white point with respect to changing Up viewing angle. The chart shows the reduced color shift with respect to changing view angle provided by the teachings of the present disclosure.
Figure 18:
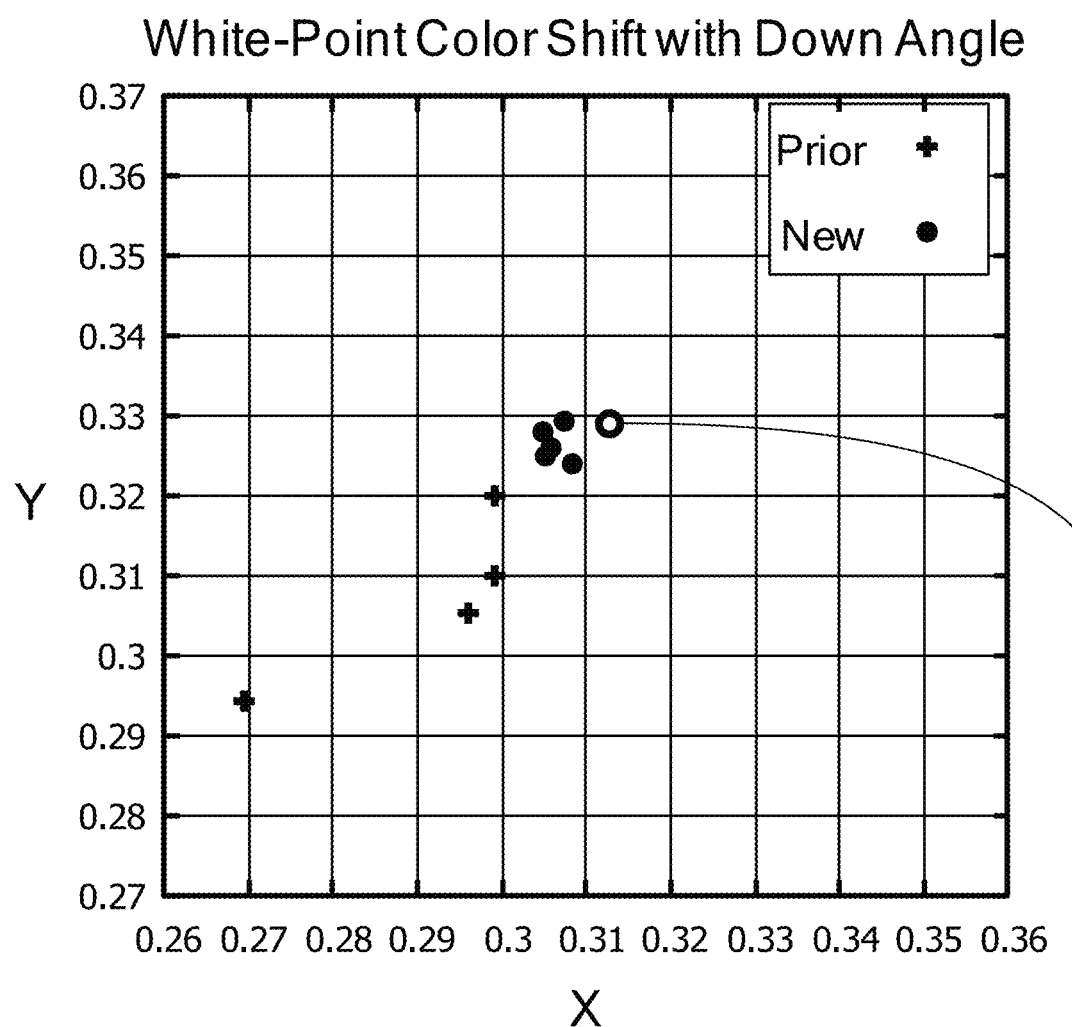
FIG. 18 is an X-Y chromaticity chart showing the location in X-Y coordinates for the measured 6500° K white point with respect to changing Down viewing angle. The chart shows the reduced color shift with respect to changing view angle provided by the teachings of the present disclosure.

Turning now to FIG. 15-FIG. 18, shown are chromaticity charts that compare prior display systems to the new display systems enabled by the teachings herein. Specifically, each chart shows the reduced color shift with respect to changing view angle provided by the teachings of the present disclosure. In each of the charts, FIG. 15-FIG. 18, the D65 white point is indicated. The bold cross symbol denotes experimentally arrived at measurements of prior art system, whereas the bold dot symbol denotes experimentally arrived at measurements of a system built according to the present teachings. In the figures, measurements closest to the D65 white point correspond to display systems that will show the least color shift whereas measurements farthest away from D65 correspond to display systems that will show the most color shift. FIG. 15 is an X-Y chromaticity chart showing the location in X-Y coordinates for the measured 6500° K white point with respect to changing Right viewing angle. FIG. 16 is an X-Y chromaticity chart showing the location in X-Y coordinates for the measured 6500° K white point with respect to changing Left viewing angle. FIG. 17 is an X-Y chromaticity chart showing the location in X-Y coordinates for the measured 6500° K white point with respect to changing Up viewing angle. FIG. 18 is an X-Y chromaticity chart showing the location in X-Y coordinates for the measured 6500° K white point with respect to changing Down viewing angle. From the figures one can readily see that the bold crosses are farther away from the D65 point than the bold dots in every instance depicted, hence the teachings of the present disclosure demonstrate significant improvement over prior systems.

Although the present invention has been described in considerable detail with reference to certain preferred versions thereof, other versions are possible. It may be desirable to combine features shown in various embodiments into a single embodiment. A different number and configuration of features may be used to construct embodiments of the disclosure that are entirely within the spirit and scope of the present disclosure. Therefore, the spirit and scope of the appended claims should not be limited to the description of the preferred versions contained herein.

Any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

What is claimed is:

1. A light emitting display module comprising:
   a first plurality of light emitting elements disposed on a substrate in a primary orientation, the first plurality of light emitting elements; and
   a second plurality of light emitting elements disposed on the substrate in a complementary orientation defined as about a 180-degree rotation of the primary orientation, each of the second plurality of light emitting elements disposed adjacent to one or more of the first plurality of light emitting elements,
   wherein the first plurality of light emitting elements and the second plurality of light emitting elements are disposed on the substrate in a predetermined pattern to form a viewing plane, and each of the first plurality and the second plurality of light emitting elements emits a D65 white point as measured in 1931 CIE X-Y chromaticity space at a center gaze angle, a color shift of the D65 white point measured as a distance in 1931 CIE X-Y chromaticity space is:
   at most 0.0071 at an upward gaze angle up to 80 degrees;
   at most 0.0056 at a downward gaze angle up to 80 degrees;
   at most 0.0091 at a leftward gaze angle of up to 80 degrees; and
   at most 0.0090 at a rightward gaze angle up to 80 degrees.

2. The light emitting display module of claim 1, wherein each light emitting element of the first plurality and the second plurality of light emitting elements is disposed on the substrate a pitch distance away from an adjacent light emitting element.

3. The light emitting display module of claim 2, wherein the pitch distance is uniform across the viewing plane.

4. The light emitting display module of claim 1, wherein each of the first plurality and the second plurality of light emitting elements comprises a first light emitting device configured to produce a first color and a second light emitting device configured to produce a second color.

5. The light emitting display module of claim 4, wherein the first color and the second color is selected from the group consisting of red, green, and blue.

6. The light emitting display module of claim 4, wherein the first light emitting device and the second light emitting device emits the D65 white point as measured in 1931 CIE X-Y chromaticity space at the center gaze angle.

7. The light emitting display module of claim 1, wherein the center gaze angle defined as a gaze angle onto the viewing plane with a direction that is perpendicular to the viewing plane.

8. The light emitting display module of claim 1, wherein the light emitting display module has a center gaze angle defined as a gaze angle onto the viewing plane with a direction that is perpendicular to the viewing plane.

9. A light emitting display system comprising:
   a first plurality of light emitting elements disposed on a substrate in a primary orientation, the first plurality of light emitting elements; and a second plurality of light emitting elements disposed on the substrate in a complementary orientation defined as about a 180-degree rotation of the primary orientation, each of the second plurality of light emitting elements disposed adjacent to one or more of the first plurality of light emitting elements, wherein the first plurality of light emitting elements and the second plurality of light emitting elements are disposed on the substrate in a predetermined pattern to form a viewing plane having a center gaze angle defined as a gaze angle onto the viewing plane with a direction that is perpendicular to the viewing plane, and each of the first plurality and the second plurality of light emitting elements emits a D65 white point as measured in 1931 CIE X-Y chromaticity space at the center gaze angle, a color shift of the D65 white point, measured as a distance in 1931 CIE X-Y chromaticity space is:

at most 0.0071 at an upward gaze angle of 20 degrees;
at most 0.0055 at a downward gaze angle of 20 degrees;
at most 0.0061 at a leftward gaze angle of 20 degrees; and
at most 0.0062 at a rightward gaze angle of 20 degrees.

10. The system of claim 8, wherein a color shift of the D65 white point, measured as a distance in 1931 CIE X-Y chromaticity space is:

at most 0.0049 at an upward gaze angle of 40 degrees;
at most 0.0034 at a downward gaze angle of 40 degrees;
at most 0.0091 at a leftward gaze angle of 40 degrees; and
at most 0.0090 at a rightward gaze angle of 40 degrees.

11. The system of claim 8, wherein a color shift of the D65 white point, measured as a distance in 1931 CIE X-Y chromaticity space is:

at most 0.0034 at an upward gaze angle of 60 degrees;
at most 0.0056 at a downward gaze angle of 60 degrees;
at most 0.0054 at a leftward gaze angle of 60 degrees; and
at most 0.0061 at a rightward gaze angle of 60 degrees.

12. The system of claim 8, wherein a color shift of the D65 white point, measured as a distance in 1931 CIE X-Y chromaticity space is:

at most 0.0026 at an upward gaze angle of 80 degrees;
at most 0.0034 at a downward gaze angle of 80 degrees;
at most 0.0054 at a leftward gaze angle of 80 degrees; and
at most 0.0072 at a rightward gaze angle of 80 degrees.

13. A light emitting display system comprising:

a first plurality of light emitting elements disposed on a substrate in a primary orientation, the first plurality of light emitting elements; and a second plurality of light emitting elements disposed on the substrate in a complementary orientation defined as about a 180-degree rotation of the primary orientation, each of the second plurality of light emitting elements disposed adjacent to one or more of the first plurality of light emitting elements;

wherein each of the first plurality and the second plurality of light emitting elements emits a D65 white point as measured in 1931 CIE X-Y chromaticity space at a center gaze angle, a color shift of the D65 white point measured as a distance in 1931 CIE X-Y chromaticity space is:

at most 0.0071 at an upward gaze angle of 20 degrees;
at most 0.0055 at a downward gaze angle of 20 degrees;
at most 0.0061 at a leftward gaze angle of 20 degrees; and
at most 0.0062 at a rightward gaze angle of 20 degrees.

14. The light emitting display system of claim 9, wherein each light emitting element of the first plurality and the second plurality of light emitting elements is disposed on the substrate a pitch distance away from an adjacent light emitting element.

15. The light emitting display system of claim 14, wherein the pitch distance is uniform across the substrate.

16. The light emitting display system of claim 9, wherein each of the first plurality and the second plurality of light emitting elements comprises a first light emitting device configured to produce a first color and a second light emitting device configured to produce a second color.

17. The light emitting display system of claim 15, wherein the first color and the second color is selected from the group consisting of red, green, and blue.

* * * * *